United States Patent [19]
Kerth et al.

[11] Patent Number: 5,621,339
[45] Date of Patent: Apr. 15, 1997

[54] METHOD AND APPARATUS FOR REMOVING TRAPPED OXIDE CHARGE FROM A DIFFERENTIAL INPUT STAGE

[75] Inventors: Donald A. Kerth; Eric J. Swanson, both of Austin, Tex.

[73] Assignee: Crystal Semiconductor, Austin, Tex.

[21] Appl. No.: 121,244

[22] Filed: Sep. 14, 1993

[51] Int. Cl.$^6$ ................................................ H03K 5/22
[52] U.S. Cl. ............................ 327/65; 327/427; 327/563
[58] Field of Search ................................. 307/494, 491, 307/572, 573, 574, 575, 577, 584, 263, 443, 497, 501; 330/253; 327/65, 170, 362, 379, 427, 563, 581

[56] References Cited

U.S. PATENT DOCUMENTS

| | | | |
|---|---|---|---|
| 4,028,558 | 6/1977 | Heller et al. | 307/355 |
| 5,142,244 | 8/1992 | Glica et al. | 307/494 |
| 5,247,210 | 9/1993 | Swanson | 307/355 |

OTHER PUBLICATIONS

Theodore L. Tweksbury, Hae–Seung Lee and Gerald A. Miller, "The Effects of Oxide Traps on the Large–Signal Transient Response of Analog MOS Circuits" in *IEEE Journal of Solid State Circuits*, vol. 24, No. 2, Apr. 1989, pp. 542–544.

Gerald Miller, Michael Timko, Hae–Seung Lee, et al., "An 18b 10µs Self–Calibrating ADC" in 1990 *ISSCC Digest of Tech. Papers*, pp. 168–169.

Khen–Sang Tan, Sami Kiriaki, Michiel DeWit, et al., "Error Correction Techniques for High–Performance Differential A/D Converters" in *IEEE Journal of Solid–State Circuits*, vol. 25, No. 6, Dec. 1990, pp. 1318–1327.

*Primary Examiner*—William L. Sikes
*Assistant Examiner*—James A. Dudek
*Attorney, Agent, or Firm*—Gregory M. Howison

[57] ABSTRACT

A differential input stage for a data conversion device includes two sections, one section for operating during a high stress portion of a charge transfer operation and one portion for operating during the remainder of the charge transfer operation. The first portion is comprised of two differential transistors (84) and (86) having the sources and bodies thereof connected to a source coupled node and connected through a switch (94) to a current source (92). The drains of transistors (84) and (86) are connected through switches (110) and (112), respectively, to output terminals. During the second half of the charge transfer operation, differential transistors (78) and (88), having the sources and bodies thereof connected to a source coupled node and connected to the current source (92) through a switch (90), are rendered operable with the drains thereof connected through switches (96) and (104), respectively, to the output terminals. Only one of the differential pairs is operable at any one time. When they are not operational, the sources, bodies and drains thereof are connected together and to a flush terminal (118) through respective switches. These switches flush out trapped oxide charges and allow the charges to once again become mobile.

23 Claims, 5 Drawing Sheets

METHOD AND APPARATUS FOR REMOVING TRAPPED OXIDE CHARGE FROM A DIFFERENTIAL INPUT STAGE

TECHNICAL FIELD OF THE INVENTION

The present invention pertains in general to data conversion devices such as analog-to-digital converters and, more particularly, to a technique for removing a trapped oxide charge from the differential input to either the comparator or the amplifier in the data conversion device.

CROSS REFERENCE TO RELATED APPLICATIONS

This application is related to U.S. Pat. No. 5,247,210, issued Sep. 21, 1993 and entitled "Method and Circuitry for Decreasing the Recovery Time of an MOS Differential Voltage Comparator".

BACKGROUND OF THE INVENTION

Whenever MOSFET transistors are subjected to excessive gate and drain voltages for lengthy periods of time (>100 seconds), damage can result to the transistor due to hot carriers injected into the gate oxide. This damage is usually measured as a threshold voltage or a transconductance shift over time. For MOSFETs subjected to relatively short stress periods between 100 nanoseconds to 1 microsecond, a recoverable parameter shift occurs. This is disclosed in T. Tewksberry, et al., *The Effects of Oxide Traps on the Large-Signal Transient Response of Analog MOS Circuits*, JSSC, Vol. 24, No. 2, pp. 542–544, Apr. 1989. If, for example, the gate of an N-channel MOSFET is pulsed for 500 ns with a 1.5 volt overdrive, a 200 µV shift in the threshold voltage is exhibited that recovers in approximately 15 µs. The initial shift and recovery time is dependent on the magnitude of the overdrive and the stress time. It is believed that this is due to carriers that are trapped in the oxide interface during the stress period. Once the stress is removed, the trapped charges are redistributed through the channel at a rate proportional to the trap energy.

In successive approximation analog-to-digital converters with relatively high resolution of the order of 16 bits, this trapped charge phenomena has been observed in the comparator input stages thereof. During initial comparison phases, when the Most Significant Bits (MSBs) are tested, the comparator input is stressed due to large input voltages that are present. This stress introduces a data dependent offset error that corrupts later critical comparisons. This has been eliminated in high resolution converters by implementing a flush procedure. This is disclosed in U.S. Pat. No. 5,247,210 entitled "Method and Circuitry for Decreasing the Recovery Time of an MOS Differential Voltage Comparator", which is incorporated herein by reference. After a comparison is made, a field is applied across the gate-to-bulk regions of the comparator input devices by pulling up the well, source and drain terminals thereof to some positive voltage. This field obliterates any data dependent charge left within the oxide.

Another solution to the trapped oxide charge in a comparator input stage was disclosed in K. Tan, et al., *Error Correction Techniques for High Performance Differential A/D Converters*, JSSC Vol. 25, No. 6, pp. 1318–1327, Dec. 1990. The Tan, et al. reference discloses the use of two comparators, a fine comparator and a rough comparator. During the initial MSB comparison phases when large input voltages may be present, the course comparator is utilized. During the final LSB comparison, the fine comparator is utilized. During these latter comparisons, the comparator input voltages are small and, therefore, the fine comparator would not be stressed. Errors introduced by the course comparator are corrected for by utilizing redundant overlap. In another approach for removing stresses from the input MOSFETs, the comparator input states can be designed in which the input MOSFETs are never stressed. This is disclosed in G. Miller, et al., *An 18B 10fts Self-Calibrating ADC*, 1990, ISSCC Digest of Tech. Papers, pp. 168–169.

The trapped oxide phenomena has also been recognized in operational amplifiers and feedback configurations when utilized in low power delta-sigma modulators. The input stage in the transfer function is comprised of an integrator which slews for approximately 500 ns during the dump period. When the amplifier slews, the input devices are stressed in a data dependent manner. The slew time is dependent upon the amount of input charge that is transferred to the feedback capacitor. The stress introduces a data dependent offset voltage which corrupts the charge transfer process. Since this a non-linear phenomena, the linear converter is affected and harmonic distortion results.

SUMMARY OF THE INVENTION

The present invention disclosed and claimed herein comprises a data conversion device having contained therein an integration stage or a comparator stage operable to have trapped oxide charges removed therefrom and mobilized. The input stage to either the comparator or the integration stage is comprised of first and second differential pairs of transistors. The first pair of transistors are source coupled to a first source coupled node, with the body of each of the transistors in the first pair of transistors connected to the first source coupled node. The gates of each of the transistors in the first pair of transistors are connected to a respective one of two inputs. The second pair of transistors are source coupled to a second source coupled node, with the body of each of the transistors in the second pair of transistors connected to the second source coupled node, and the gates of each of the transistors in the second pair of transistors connected to a respective one of the two inputs. The first pair of transistors is activated by connecting the first source coupled node to a first current source whenever an input voltage stress is applied to the two inputs. The first pair of transistors is deactivated after a predetermined duration of time and then the second pair of transistors activated by connecting the second source coupled node to a second current source. After deactivating of the first pair of transistors, the first source coupled node is connected to a flush voltage that is operable to flush trapped oxide charges therein during a flush operation.

In another aspect of the present invention, the input voltage stress results from an input voltage pulse applied across the two inputs, with the voltage varying from a first voltage to a second voltage. The input voltage is maintained at the second voltage for the time that the first pair of transistors is activated and for the duration of time that the second pair of transistors is activated after deactivation of the first pair of transistors. The duration of time that the input voltage is impressed across the two inputs is a predetermined duration of time.

For the case where the active device is a differential amplifier, the first pair of transistors is operable to be activated for at least the slew time of the differential amplifier whenever the input voltage is impressed across the two inputs. For the case where the transistors in the first and second pair of transistors are N-channel transistors, the flush voltage is disposed at a voltage that is higher than the gate voltage of each of the transistors in the first pair of transistors during the flush operation.

In a further aspect of the present invention, the flush voltage is connected to both the first source coupled node and also to the opposite side of the channel of the transistors in the first pair of transistors. Further, whenever the second pair of transistors is deactivated, the second source coupled node associated therewith is connected to the flush voltage. The drains of each of the transistors in the second pair of transistors are connected to the flush voltage.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1A:
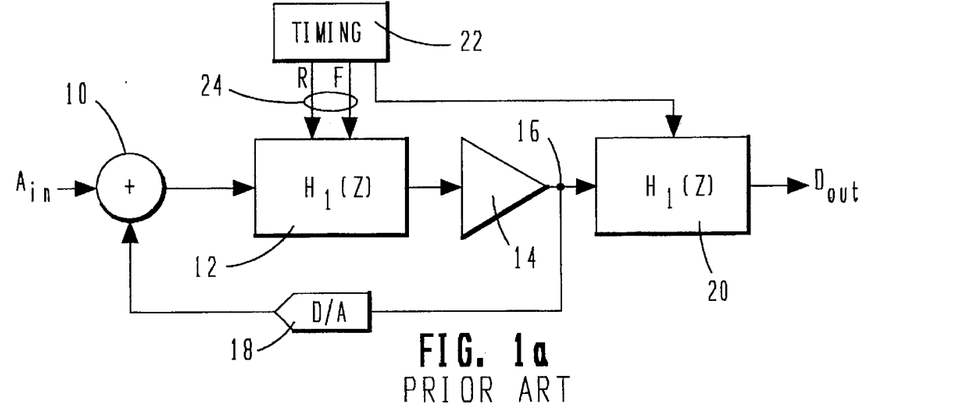
FIG. 1a illustrates a block diagram of a conventional data conversion device utilizing a delta-sigma modulator and a transfer function comprising at least an input stage of integration.

Referring now to FIG. 1a, there is illustrated a block diagram of a conventional data conversion device utilizing a delta-sigma modulator. An analog input $A_{IN}$ is input to a summing junction 10. The output of the summing junction is input to a transform device 12 having the transform $H_1(z)$. The output of the transform device 12 is input to a quantizer 14, the output of which provides a digital stream on a node 16. The node 16 is connected to the input of a D/A converter 18, the output of which is input to the other input of the summing junction 10. Additionally, the digital stream on node 16 is input to a second transform device 20, which comprises a digital filter and which has a transform function $H_2(z)$. This provides a data output on the output thereof. The system is controlled by a timing circuit 22, which timing circuit is operable to provide the various timing functions to the transform devices 12 and 20 and also to the quantizer 14. Additionally, the R and F timing signals on lines 24 are provided for controlling the flush operation, as will be described hereinbelow.

Figure 1B:
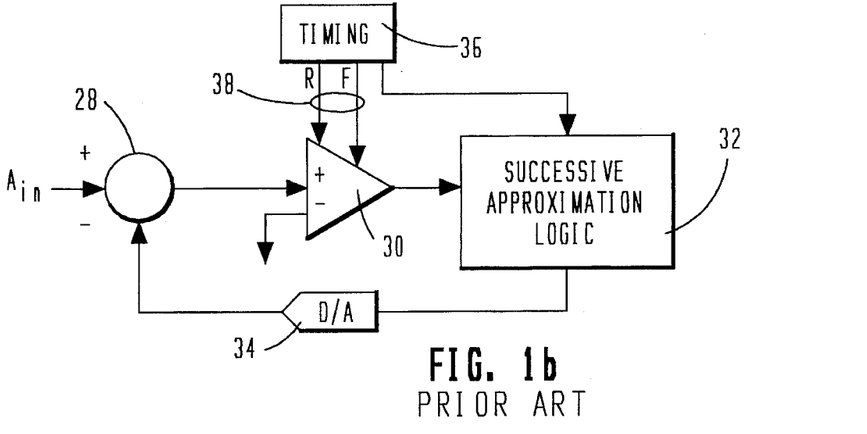
FIG. 1b illustrates a block diagram of a data conversion device utilizing a comparator input and a successive approximation algorithm.

Referring now to FIG. 1b, there is illustrated a block diagram of a conventional comparator-based successive approximation data conversion device. The analog input $A_{IN}$ is input to the positive input of a summing junction 28, the output of which is connected to the positive output of a comparator 30, the negative output thereof connected to ground. The output of comparator 30 is a two logic state output, which is input to a logic block 32, which provides for a successive approximation algorithm. The output of the logic block 32 is input to a D/A converter 34, the output of which is input to the negative input of the summing junction 28. The timing for the system is provided by a timing block 36 to provide various timing signals in accordance with a conventional successive approximation algorithm. Additionally, the flush operation of the present invention, as will be described below, is provided on lines 38 labelled R and F.

Figure 2:
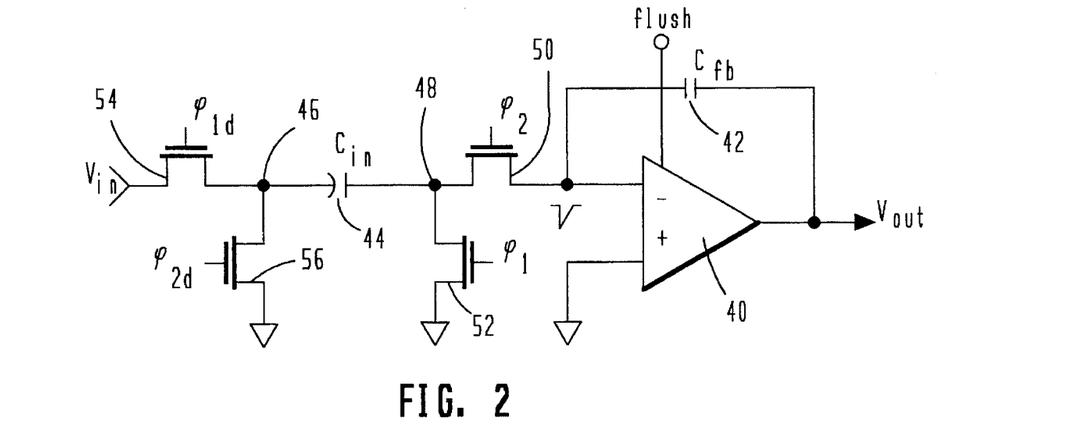
FIG. 2 illustrates a schematic diagram of a conventional integrator utilized with a delta-sigma modulator data conversion device.

Referring now to FIG. 2, there is illustrated a schematic diagram of a switched capacitor input integration stage, which stage comprises both the input stage to the transform device 12 and summing junction 10, it being noted that there is a feedback path that is left out. An operational amplifier 40 is provided having a negative and a positive input, the positive input connected to ground. Therefore, the negative input constitutes a virtual ground. A feedback capacitor 42 is provided between the negative input of the op amp 40 and the output thereof. The output providing the voltage output $V_{OUT}$. A switched capacitor 44 is connected between a node 46 and a node 48. Node 48 is connected through the source/drain path of a transistor 50 to the negative input of op amp 40, the gate thereof connected to a timing signal $\phi_2$. Node 48 is also connected through the source/drain path of a transistor 52 to ground, the gate thereof connected to timing signal $\phi_1$. The node 46 is connected through the source/drain path of a transistor 54 to a voltage input $V_{IN}$, the gate thereof connected to a timing signal $\phi_{1d}$. Node 46 is also connected to ground through the source/drain path of a transistor 56, the gate thereof connected to a timing signal $\phi_{2d}$. The op amp 40 also has provided thereto the timing signal "FLUSH", which operates on the input transistors thereof.

Figure 2A:
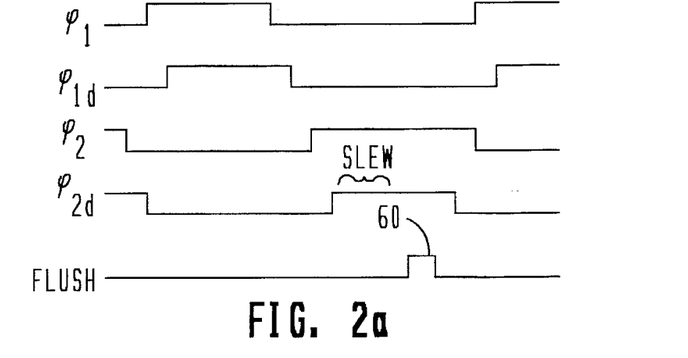
FIG. 2a illustrates a timing diagram for the circuit of FIG. 2.

Referring now to FIG. 2a, there is illustrated a timing diagram for the circuit of FIG. 2. The signals $\phi_1$ and $\phi_{1d}$ control the charging operation, wherein the input is applied to one plate of capacitor 44 and the other plate thereof is connected to ground. This is the charging operation. In the next operation, the dump operation, the one plate of capacitor 44 is connected to ground through the transistor 56 and the other plate thereof is connected to the negative input of the op amp 40 through the transistor 50 to transfer the charge thereon to the negative input of op amp 40. In the initial stage of the signals $\phi_2$ and $\phi_{2d}$, the op amp 40 will be in a "slew" mode wherein the output voltage will slew. After the slew time, a flush signal 60 is applied, but this must be terminated before the charge transfer operation is complete. Therefore, the flush operation must occur after the slew is completed and prior to the end of the charge transfer operation.

Figure 2B:
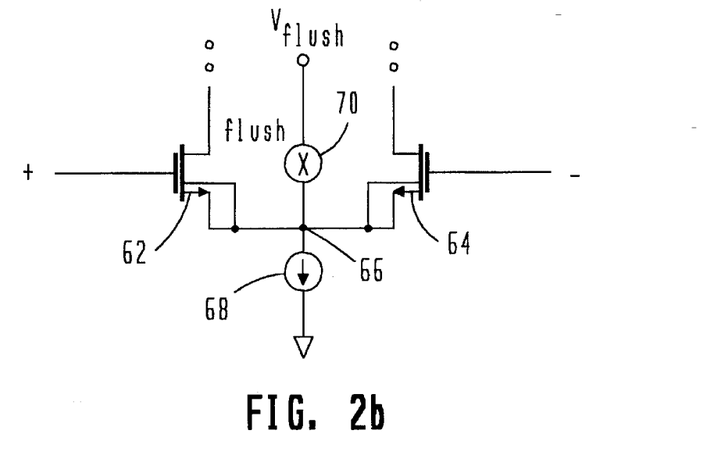
FIGS. 2b–2d illustrate schematic diagrams of various configurations of the input differential amplifier stage to the op amp.

Referring now to FIG. 2b, there is illustrated a schematic diagram of the input stage to the op amp 40. A differential pair of transistors, comprised of an N-channel transistor 62 and an N-channel transistor 64, are source coupled to a source coupled node 66, the body of each of the transistors 62 and 64 connected to the node 66. The node 66 is connected to one side of a current source 68, the other side of current source 68 connected to ground. The other side of the source/drain paths of transistors 62 and 64, the drains, are connected to loads, which is conventional. Additionally, a switch 70 is provided that is connected between node 66 and a flush voltage $V_{Flush}$. Switch 70 is controlled by the FLUSH signal, which switch 70 is operable to hold the node 66 higher than the gate voltage, such that the voltage $V_{Flush}$ must be at a voltage that is typically higher than the gate voltage during the flush period. This in effect removes the trapped oxide charges in the gate oxide from the transistors 62 and 64 and allows the charges to redistribute or become "mobile" again. One disadvantage to the system of FIG. 2b is that the amplifier 40 is effectively disabled during the flush period. The amplifier cannot aid the charge transfer process during this time.

Figure 2C:
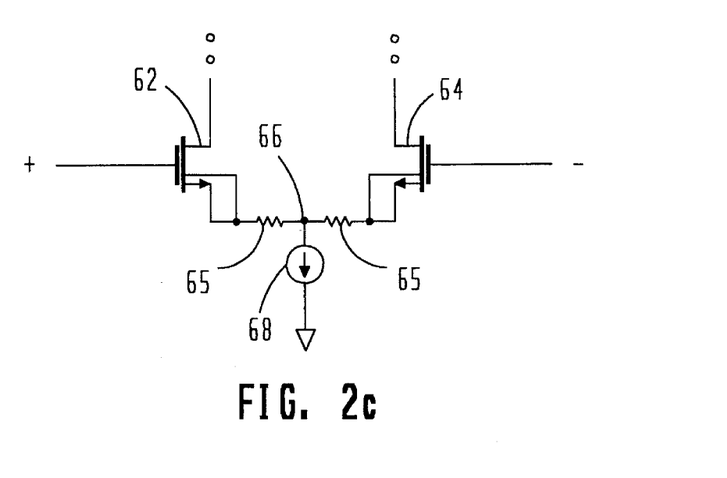
Figure 2D:
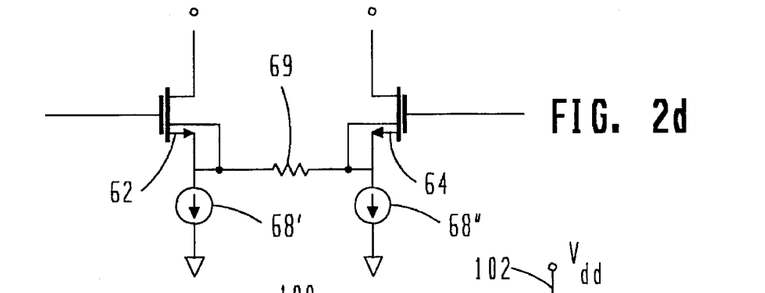

Referring now to FIGS. 2c and 2d, there are illustrated alternate embodiments of the source-coupled transistor configuration that illustrate the use of a degeneration resistor. In the embodiment of FIG. 2c, the source and body of transistor 62 are connected through a resistor 65 to the node 66, and the source and body of transistor 64 are connected through a resistor 67 to the node 66. In the embodiment of FIG. 2d, the sources and bodies of transistors 62 and 64 are connected together through a resistor 69. A first current source 68' is connected between the source of transistor 62 and ground and a current source 68" is connected between the source of transistor 64 and ground. However, for the purposes of the present description, all the configurations of FIG. 2b, FIG. 2c and FIG. 2d will comprise a "source-coupled configuration."

Figures 3, 3A:
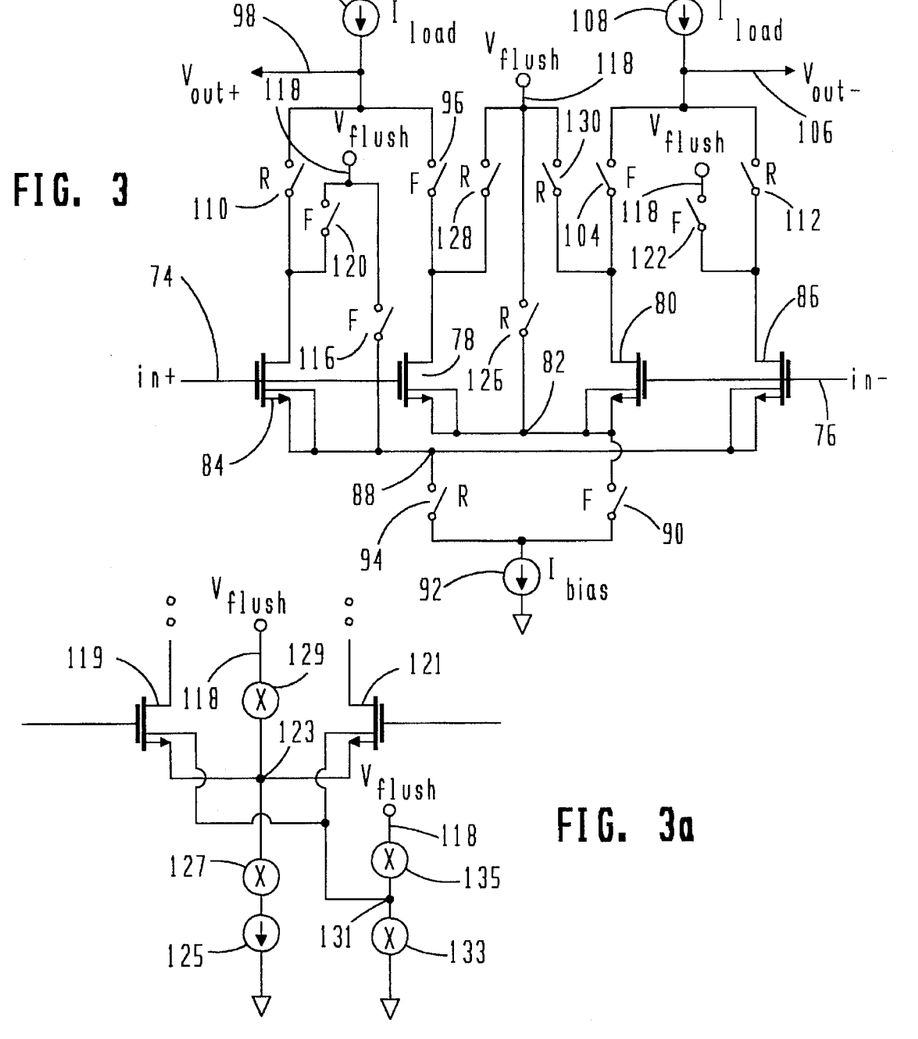
FIG. 3 illustrates a schematic diagram of the input stage utilizing the switches for providing the flush operation.
FIG. 3a illustrates a schematic diagram of an alternate flush configuration.

Referring now to FIG. 3, there is illustrated an embodiment of the invention which does not disable the amplifier 40. It should be noted that the amplifier 40 constitutes the input stage of the active device with which it is associated. A positive input is input on a terminal 74 and a negative input is input on a terminal 76. Two sets of differential pair stages are provided, a first set comprised of N-channel transistor 78 and N-channel transistor 80, having the sources and bodies thereof connected to a source coupled node 82. A second set includes an N-channel transistor 84 and an N-channel transistor 86 having the sources and bodies thereof connected to a source coupled node 88. The transistors 78 and 80 provide a "fine" differential input pair and the transistors 84 and 86 provide a "rough" differential input pair. The gates of transistors 78 and 84 are connected to the input terminal 74 and the gates of the transistors 80 and 86 are connected to the input terminal 76. The source coupled node 82 is connected through a switch 90 to one side of a current source 92, the other side thereof connected to ground. The switch 90 is labelled "F", representing the Fine operation. Similarly, the source coupled node 88 is connected to the one side of the current source 92 through a switch 94, switch 94 labelled "R", representing the "Rough" operation.

The drain of transistor 78 is connected through a switch 96, labelled "F" to an output node 98. The node 98 comprises the positive voltage $V_{out+}$, the output node 98 connected to one side of a current source 100. Current source 100 provides a load current. The other side of the current source 100 is connected to a positive supply terminal 102, labelled $V_{dd}$. The transistor 80 is connected through a switch 104, labelled "F," to an output node 106, labelled $V_{out-}$. The output node 106 is connected to the one side of a current source 108, the other side of the current source 108 connected to the $V_{dd}$ terminal 102. It can therefore be seen that whenever the Fine operation is initiated, the switches 90, 96 and 104 are closed such that only the transistors 78 and 80 are operational.

The drain of transistor 84 is connected through a switch 110, labelled "R", to the output node 98. Similarly, the drain of transistor 86 is connected through a switch 112, labeled "R" to the output node 106. Therefore, whenever the amplifier is operating in the Rough mode, the switches 110, 112 and 94 will be closed and the differential amplifier comprised of transistors 84 and 86 will be operational, whereas the differential amplifier comprised of the transistors 78 and 80 will be non-operational.

In the initial part of the operation, the Rough operation, the transistors 84 and 86 are stressed such that they may trap charge in the oxide. In order to release this charge such that it is once again mobile, it is necessary to "flush" the charge. This is accomplished by connecting the source coupled node to a predetermined voltage level that is at a voltage level that is higher than the gate voltage during the flush operation. This is achieved by raising the common source node 88, and the bodies of the attached transistors 84 and 86 to a voltage $V_{Flush}$ on a terminal 118 through a switch 116, labelled "F". Therefore, whenever the Fine mode of operation controls the system, the switch 116 will be closed and the switch 110 will be open, in addition to the switch 94. The source coupled node 88 will then be pulled up to the voltage $V_{Flush}$ on a terminal 118. Although this switch 116 may be sufficient to perform the Flush operation, it may be desirable to connect the drains of transistors 84 and 86 to the voltage $V_{Flush}$ during the Fine mode of operation. Therefore, the drain of transistor 84 is connected through a switch 120 labelled "F" to the terminal 118 and the drain of transistor 86 is connected through a switch 122, labelled "F" to the terminal 118.

Although the transistors 78 and 80 operate under a lower stress condition, since they are turned on during the second half of the "dump" cycle, as will be described hereinbelow, it may be desirable to flush any potential trapped oxide from these transistors. This is facilitated with a switch 126 labelled "R" connected between the source coupled node 82 and the terminal 118. A switch 128 labelled "R" is connected between the drain of transistor 78 and the terminal 118. Similarly, a switch 130 is connected between the drain of transistor 80 and the terminal 118. Therefore, whenever the amplifier is operating in the Rough mode of operation, the sources, bodies and drains of transistors 78 and 80 are connected to the voltage $V_{Flush}$ on terminal 118, which voltage is at a greater voltage than any voltage that exists on the input terminals 74 and 76 during the flush period.

Referring now to FIG. 3a, there is illustrated an alternate embodiment for the flush operation. Although the embodiment of FIG. 3 illustrates the source-coupled node 82 and the source-coupled node 88 being connected through the respective switches 126 and 116 to the flush terminal 118, it should be understood that it is only necessary to connect the bodies and the sources to the flush terminal 118 during a flush operation. During normal operation, it is not necessary to have the bodies of the transistors connected to the source-coupled node. In the illustration of FIG. 3a, there are illustrated two source-coupled transistors 119 and 121, having the sources thereof coupled to a node 123. Node 123, during normal operation, is connected to one side of the current source 125 through a switch 127. During a flush operation, switch 127 is opened and the node 123 is connected to the flush terminal 118 through a switch 129. However, in the illustration of FIG. 3a, the bodies of transistors 119 and 121 are connected together to a node 131. Node 131, during normal operation, is connected to ground or a negative voltage through a switch 133 and, during the flush operation, is connected through a switch 135 to the flush terminal 118.

Figure 4:
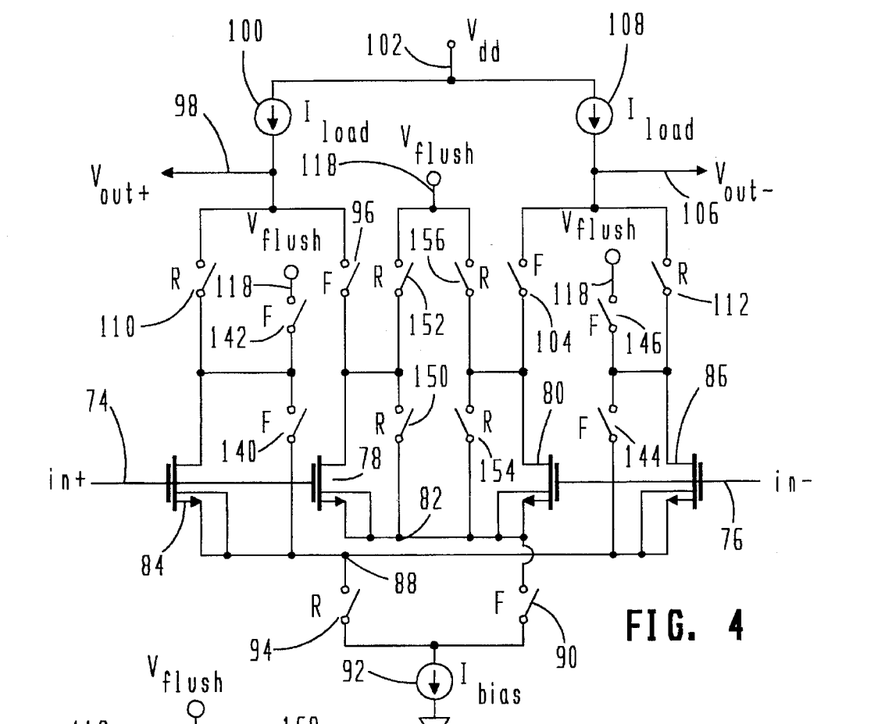
FIG. 4 illustrates the preferred embodiment of the circuit of FIG. 3.

Referring now to FIG. 4, there is illustrated the preferred embodiment of the present invention. In the embodiment of FIG. 4, only two switches are required in order to connect the sources, bodies and drains of transistors 84 and 86 and also transistors 78 and 80 to the Flush voltage terminal 118. The transistor 84 has the source and body thereof connected through a switch 140, labelled "F" to the drain thereof. The drain of transistor 84 is also connected through a switch 142 labelled "F" to the Flush terminal 118. Similarly, transistor 86 has the source and body thereof connected to the drain thereof through a switch 144 labelled "F" and the drain of transistor 86 is connected to the Flush voltage terminal 118 through a switch 146 labelled "F". The transistor 78 has the source and body thereof connected to the drain thereof through a switch 150, labelled "R," and the drain thereof connected to the flush terminal 118 through a switch 152 labelled "R". Transistor 80 has the source and body thereof connected to the drain thereof through a switch 154, labelled "R," and the drain of transistor 80 is connected to the Flush terminal 118 through a switch 156.

Figure 4A:
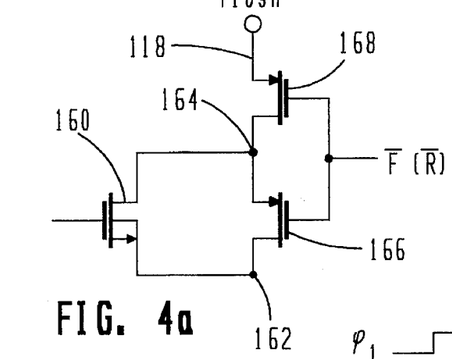
FIG. 4a illustrates a detail of the switching configuration of the embodiment of FIG. 4.

Referring now to FIG. 4a, there is illustrated a detail of the switch pairs utilized to connect the source and drains of the various transistors to the Flush terminal 118. A representative N-channel transistor 160 has the source thereof connected to a node 162 and the drain thereof connected to a node 164. A P-channel transistor 166 has the source/drain path thereof connected between the node 162 and the node 164, and a P-channel transistor 168 has the source/drain path thereof connected between the node 164 and the Flush terminal 118. The gates of transistors 168 and 166 are connected to the inverse of the Fine or Rough signals, such that whenever the system is in the Rough or the Fine operation, the respective transistors 166 and 168 are conductive. By utilizing this configuration, any transient bi-polar effect that may be present is eliminated. For example, the bi-polar transistor that has the base thereof formed by the well of the transistor 160 will be inhibited from turning on, since node 164, which is the NPN bipolar emitter, is always at a higher or equal voltage than node 162.

Figure 5:
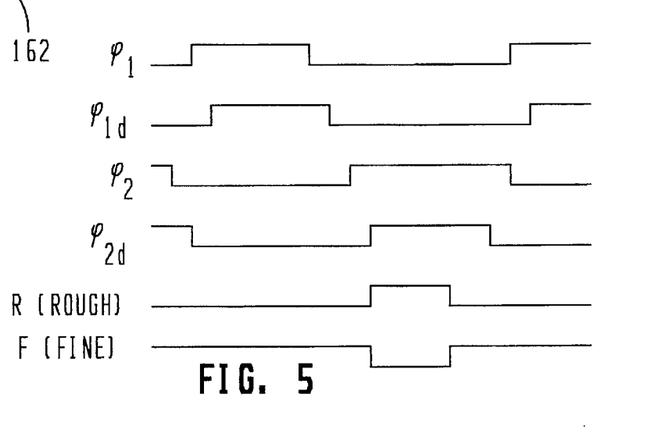
FIG. 5 illustrates a timing diagram for the circuits of FIGS. 3 and 4.

Referring now to FIG. 5, there is illustrated a timing diagram for the switched capacitors of FIG. 2 and the Rough and Fine inputs, "R" and "F". As described above, the switched capacitor 44 is charged during the charging operation whenever $\phi 1$ and $\phi 1d$ are high. During the "dump" operation, $\phi 2$ and $\phi 2d$ go high. Whenever $\phi 2d$ goes high, the rough signal also goes high, such that transistors 84 and 86 are operational; that is, switches 94, 110 and 112 are closed and the associated Flush switches are open. Similarly, the switches 90, 96 and 104 are open, disabling the transistors 78 and 80. The Rough control signal stays high for a sufficient duration of time to allow the amplifier to "slew" to the final voltage. Thereafter, the Rough signal goes low and the Fine signal goes high, disabling the transistors 84 and 86 and enabling transistors 78 and 80. It can be seen that the differential transistors 84 and 86 associated with the Rough operation are only turned on during the high stress portion, i.e., during slew. After slew, the Rough portion of the amplifier is turned off and the Fine portion turned on, consisting of transistors 78 and 80, to finish the charge transfer operation. The finishing part of the transfer operation is not subject to the high stress levels and, therefore, has very little trapped oxide, if any, associated therewith. Therefore, turning on only the Rough or Fine portion of the differential amplifier during its operational period provides benefits. However, the reason for flushing the transistors associated with the Rough operation is that any charges trapped in the oxide during the high stress operation will be liberated and, once again, made mobile, thus further reducing distortion.

Figure 6:
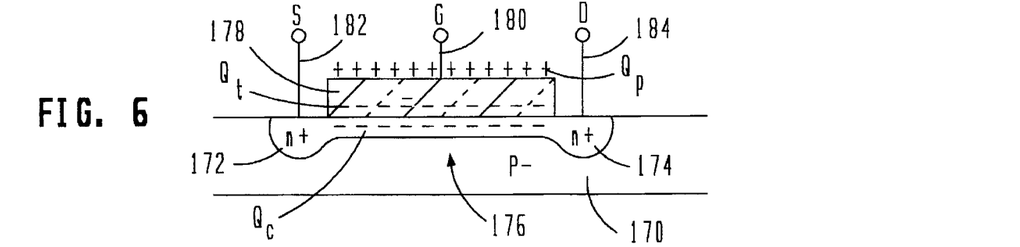
FIG. 6 illustrates a cross-sectional diagram of a conventional transistor showing the trapped oxide charge.

Referring now to FIG. 6, there is illustrated a cross-sectional view of an MOS transistor illustrating the trapped charge phenomena. A substrate 170 is provided having a doping of the p- type conductivity material. A source region 172 and a drain region 174 are formed in the substrate 170 of n+ conductivity material and separated by a channel region 176. A layer of gate oxide 178 is disposed over the channel region 176 with the upper side thereof connected to a gate terminal 180. The source region 172 is connected to a source terminal 182 and the drain region 174 is connected to a drain terminal 184.

Whenever the gate terminal 180 of the transistor is raised to a relatively high voltage to cause a stress on the channel, negative charge is pulled into "traps" within the gate oxide 178, proximate to the channel region 176. The charge passing through the channel region 176 is carded through a narrow conductive region. During the stress, a high positive charge $Q_P$, is present on the upper surface of the oxide layer 178 and a negative channel charge $Q_C$ is present in the channel. This results in a negative charge $Q_t$ contained within "traps" within the oxide layer 178. Whenever the stress is removed, the trapped negative charge $Q_t$ remains. This causes an offset in the threshold voltage and results in a non-linearity that is a function of the input voltage. If the trapped charge is not removed, this will result in harmonic distortion.

Figure 7:
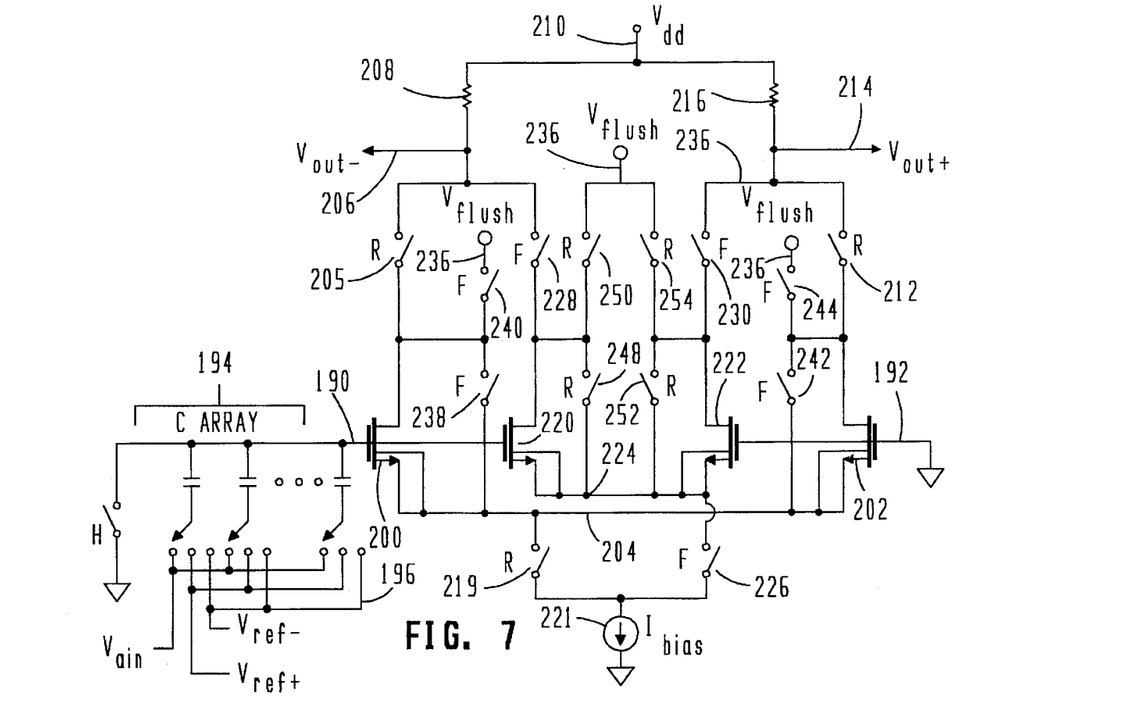
FIG. 7 illustrates a schematic diagram of the input stage for a comparator implementation of the flush technique described above.

Referring now to FIG. 7, there is illustrated a schematic diagram of a comparator implementation of the present invention. A first input terminal 190 is provided that is connected to a capacitor array. A second input terminal 192 is connected to ground. The terminals 190 and 192 comprise the two inputs to the comparator. The capacitor array is a conventional capacitor array 194 that is comprised of a plurality of capacitors having one plate thereof connected to the terminal 190 and the other plate thereof connected to a switched network 196. The switched network 196 is operable to selectively connect the terminals of the capacitors in the array 194 to one of two reference voltages, a negative reference voltage $V_{REF-}$, a positive reference voltage $V_{REF+}$, or an input voltage $V_{AIN}$. This is done in accordance with a successive approximation algorithm, this being a conventional operation.

The input differential portion of the comparator is comprised of a Rough portion and a Fine portion. The Rough portion is comprised of an N-channel transistor 200 and an N-channel transistor 202, having the sources and bodies thereof connected to a source coupled node 204. The drain of transistor 200 is connected through a switch 205 to an output terminal 206 labelled $V_{OUT-}$. The output terminal 206 is connected through a resistive load 208 to a $V_{dd}$ terminal 210. Switch 205 is labelled "R". Similarly, the drain of transistor 202 is connected through a switch 212 labelled "R" to an output terminal 214 labelled $V_{OUT+}$. The output terminal 214 is connected to the $V_{dd}$ terminal 210 through a resistive load 216. The source coupled node 204 is connected through a switch 219 labelled "R" to one side of a current source 221, the other side of current source 221 connected to ground.

The Fine portion of the comparator input is comprised of two N-channel transistors 220 and 222, having the sources and bodies thereof connected to a source coupled node 224. The source coupled node 224 is connected through a switch 226 to the other side of the current source 221. The drain of transistor 220 is connected through a switch 228, labelled "F" to the output terminal 206 and the drain of transistor 222 is connected through a switch 230 labelled "F" to the output terminal 214. Therefore, transistors 200 and 202 are enabled during the Rough portion of the operation and the transistors 220 and 222 are enabled during the Fine portion of the operation.

The Flush operation of transistors 200 and 202 is achieved through a set of switches that connect the sources, bodies and drains thereof to a flush terminal 236. The source and body of transistor 200 is connected through a switch 238 labelled "F" to the drain thereof, and the drain of transistor 200 is connected through a switch 240 to the terminal 236. Similarly, the source and body of transistor 202 is connected to the drain thereof through a switch 242, labelled "F" and the drain of transistor 202 is connected through a switch 244 to the flush terminal 236. The transistors 220 and 222 are also flushed during the Rough operation with a set of switches that connect the sources, bodies and drains thereof to the flush terminal 236. The source and body of transistor 220 is connected to the drain thereof through a switch 248, labelled "R", and the drain of transistor 220 is connected to the flush terminal 236 through a switch 250, labelled "R". The source and body of transistor 222 is connected through a switch 252, labelled "R", to the drain thereof, and the drain of transistor 222 is connected through a switch 254, labelled "R", to the flush terminal 236.

By performing the Flush operation without disconnecting the gates of the respective differential transistor pairs, an advantage is achieved. This is due to the fact that the charge that was trapped in the initial stage, the Rough stage, is returned as a result of the Flush operation. This is to be compared to the prior art system wherein the gate of the Course comparator is disconnected when the gate of the Fine comparator is connected. Therefore, any charge trapped during the Course operation will be lost to the conversion operation when the gate of the Course comparator is disconnected. By comparison, the present system maintains the connection of the gate of the Rough differential pair of transistors to the input, such that any charges trapped during the Rough operation will be returned during the Fine operation as a result of the Flush operation.

Figure 8:
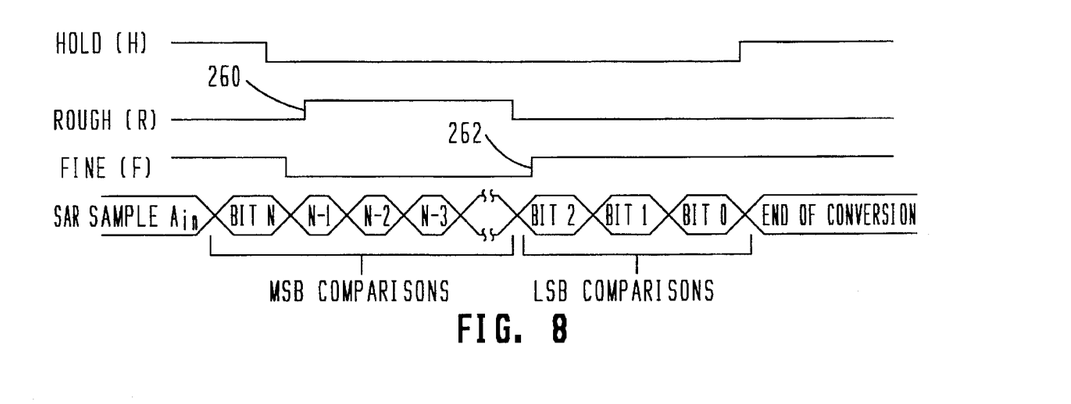
FIG. 8 illustrates a timing diagram for the circuit of FIG. 7.

Referring now to FIG. 8, there is illustrated a timing diagram for the comparator operation. The Rough operation is initiated at an edge 260 wherein the first MSB comparison is made with Bit N. This continues for the entire duration of the Rough operation until all the MSB comparisons are made. Thereafter, the Fine operation is initiated at a rising edge 262 and the LSB comparisons are made beginning with, for example, Bit 2 down to Bit 0. However, it should be understood that the selection of Bit 2 is arbitrary and it could be a higher order bit. Again, this is a conventional successive approximation algorithm.

In summary, there has been provided a method for minimizing the effect of trapped oxide charge on the operation of an input differential amplifier. The method includes providing two differential amplifier sections, a Rough section and a Fine section. The Rough section includes a differential pair of transistors with the gates thereof connected to respective ones of two input terminals and the sources thereof connected in common to a current source. The Fine section includes two differential input transistors having the gates thereof connected to the respective input terminals, and the sources thereof connected in common to a second current source. In an integrator implementation, the Rough portion is enabled during the slew portion of the "dump" operation. The transistors associated with the Rough portion are then disabled during the second portion of the charge transfer operation after slewing, and then the transistors associated with the Fine portion activated. To further reduce the effects of voltage stress on the Rough transistors, the trapped oxide charges are flushed during the operation of the Fine portion when the transistors associated with the rough portion of the differential amplifier are disabled. Further, any trapped oxide charges in the Fine portion of the amplifier are also flushed during the operation of the Rough portion of the differential amplifier. This could also be applied to a comparator and to a switched capacitor filter configuration.

Although the preferred embodiment has been described in detail, it should be understood that various changes, substitutions and alterations can be made therein without departing from the spirit and scope of the invention as defined by the appended claims.

What is claimed is:

1. A method for operating a differential pair of transistors in an active device, comprising:

configuring a first pair of transistors in a source coupled configuration, the gates of each of the transistors in the first pair connected to a respective one of two inputs;

configuring a second pair of transistors in a source coupled configuration, the gates of each of the transistors in the second pair connected to a respective one of the two inputs;

activating the first pair of transistors when an input voltage is impressed across the two inputs that is operable to stress the first pair of transistors;

deactivating the first pair of transistors after a predetermined duration of time and activating the second pair of transistors when the stress due to the input voltage is reduced; and after deactivating the first pair of transistors, connecting the sources and the bodies of the transistors in the first pair of transistors to a flush voltage that will flush trapped oxide charges therein during a flush operation.

2. The method of claim 1, and further comprising the steps of connecting the sources and bodies of the transistors in the first pair of transistors together and connecting the sources and bodies of the transistors in the second pair of transistors together.

3. The method of claim 1, wherein the active device is a differential amplifier and the step of activating the first pair of transistors is operable activate the first pair of transistors for at least the slew time of the active device when the input voltage is impressed across the two inputs.

4. The method of claim 1, wherein the transistors in the first and second pair of transistors are N-channel transistors.

5. The method of claim 4, wherein the step of connecting comprises the step of connecting the sources and bodies of the transistors in the first pair of transistors to a flush voltage that flushes the trapped oxide charges wherein the flush voltage is higher than the voltage on the gates of each of the transistors in the first pair of transistors during the flush.

6. The method of claim 1, wherein the step of connecting the sources and bodies of the transistors in the first pair of transistors to the flush voltage that will flush trapped oxide charges also comprises the step of connecting the drains of the transistors in the first pair of transistors to the flush voltage during the flush operation.

7. The method of claim 1, and further comprising the steps of deactivating the second pair of transistors prior to activating the first pair of transistors and connecting the sources and bodies of the transistors in the second pair of transistors to the flush voltage whenever the second pair of transistors is deactivated.

8. The method of claim 7, and further comprising the step of connecting the drains of the transistors in the second pair of transistors to the flush voltage during the flush operation.

9. A data conversion device having at least one active device therein with an input stage, the input stage comprising:
- a first pair of transistors disposed in a source coupled configuration, the gates of each of said transistors in said first pair connected to a respective one of two inputs to the input stage;
- a second pair of transistors disposed in a source coupled configuration, the gates of each of said transistors in said second pair connected to a respective one of said two inputs;
- a first activating device for activating said first pair of transistors to operate as an active device;
- a second activating device for activating said second pair of transistors to operate as an active device;
- a timing system for controlling said first and second activating devices such that said first pair of transistors is activated when an input voltage is impressed across said two inputs at a first stress level and then deactivated after a predetermined duration of time, said second activating device operable after said predetermined duration of time to activate said second pair of transistors when the stress level is less than said first stress level; and
- a trapped oxide flush device for connecting the sources and bodies of the transistors in the first pair of transistors to a flush voltage that will flush trapped oxide charges therein during a flush operation.

10. The data conversion device of claim 9, wherein the sources and bodies of the transistors in said first pair of transistors are connected together and the sources and the bodies of said transistors in said second pair of transistors are connected together.

11. The data conversion device of claim 9, wherein said first and second pair of transistors, when activated by said first and second activating devices, respectively, comprise a differential amplifier having a slew rate associated therewith and wherein said predetermined duration of time that said first pair of transistors is activated is greater than the slew time of the differential amplifier formed by said first pair of transistors when said first pair of transistors is activated.

12. The data conversion device of claim 9, wherein said transistors in said first and second pair of transistors are N-channel transistors.

13. The data conversion device of claim 12, wherein said flush voltage that flushes the trapped oxide charges is a voltage that is higher than the voltage on the gates of each of said transistors in said first pair of transistors during the flush period.

14. The data conversion device of claim 9, wherein said flush device is further operable to connect the drains of said transistors in said first pair of transistors to the flush voltage during the flush operation.

15. The data conversion device of claim 9, wherein said second activating device is operable to deactivate said second pair of transistors whenever said first pair of transistors is activated by said first activating device and further comprising a second flush device for connecting the sources and bodies of the transistors in said second pair of transistors to said flush voltage whenever said second pair of transistors is not activated by said second activating device.

16. The data conversion device of claim 15, wherein said second flush device is operable to connect the drains of said transistors in said second pair of transistors to said flush voltage during the flush operation.

17. An active device having at least one input stage, the input stage comprising:
- a first pair of transistors having the sources and bodies thereof connected to a first source coupled node, the gates of each of said transistors in said first pair connected to a respective one of two inputs to the input stage;
- a second pair of transistors having the sources and bodies thereof connected to a second source coupled node, the gates of each of said transistors in said second pair connected to a respective one of said two inputs;
- a first activating device for activating said first pair of transistors to operate as an active device;
- a second activating device for activating said second pair of transistors to operate as an active device;
- a timing system for controlling said first and second activating devices such that said first pair of transistors is activated when an input voltage is impressed across said two inputs at a first stress level and then deactivated after a predetermined duration of time, said second activating device operable after said predetermined duration of time to activate said second pair of transistors when the stress level is less than said first stress level;
- a trapped oxide flush device for connecting said first source coupled node to a flush voltage that will flush trapped oxide charges therein during a flush operation.

18. The active device of claim 17, wherein said first and second pair of transistors, when activated by said first and second activating devices, respectively, comprise a differential amplifier having a slew rate associated therewith and wherein said predetermined duration of time that said first pair of transistors is activated is greater than the slew time of the differential amplifier formed by said first pair of transistors when said first pair of transistors is activated.

19. The active device of claim 17, wherein said transistors in said first and second pair of transistors are N-channel transistors.

20. The active device of claim 19, wherein said flush voltage that flushes the trapped oxide charges is a voltage that is higher than the voltage on the gates of each of said transistors in said first pair of transistors during the flush operation.

21. The active device of claim 17, wherein said flush device is further operable to connect the drains of said transistors in said first pair of transistors to the flush voltage during the flush operation.

22. The active device of claim 17, wherein said second activating device is operable to deactivate said second pair of transistors whenever said first pair of transistors is activated by said first activating device and further comprising a second flush device for connecting said second source coupled node to said flush voltage whenever said second pair of transistors is not activated by said second activating device.

23. The active device of claim 22, wherein said second flush device is operable to connect the drains of said transistors in said second pair of transistors to said flush voltage during the flush operation.

* * * * *